United States Patent [19]

Nebe et al.

[11] Patent Number: 5,167,869
[45] Date of Patent: Dec. 1, 1992

[54] GOLD CONDUCTOR COMPOSITION FOR FORMING CONDUCTOR PATTERNS ON CERAMIC BASED SUBSTRATES

[75] Inventors: William J. Nebe, Wilmington, Del.; James J. Osborne, Kennett Square, Pa.

[73] Assignee: E. I. Du Pont de Nemours and Company, Wilmington, Del.

[21] Appl. No.: 780,828

[22] Filed: Oct. 23, 1991

Related U.S. Application Data

[63] Continuation of Ser. No. 508,769, Apr. 12, 1990, abandoned.

[51] Int. Cl.⁵ .................................................. H01B 1/02
[52] U.S. Cl. .................................... 252/514; 252/518; 252/519; 252/521; 106/1.13; 106/1.15; 106/1.21
[58] Field of Search ............... 252/514, 518, 519, 521; 106/1.13, 1.15, 1.21

[56] References Cited

U.S. PATENT DOCUMENTS

| | | | |
|---|---|---|---|
| 2,822,279 | 2/1958 | Larsen et al. | 252/514 |
| 3,347,799 | 10/1967 | Wagner | 252/514 |
| 3,385,799 | 5/1968 | Hoffman | 252/514 |
| 3,717,481 | 2/1973 | Short | 252/514 |
| 3,756,834 | 9/1973 | Short | 106/1 |
| 3,817,758 | 6/1974 | Short | 106/1 |
| 3,849,142 | 11/1974 | Conwicke | 252/514 |
| 3,929,674 | 12/1975 | Patterson | 252/514 |
| 3,960,777 | 6/1976 | Coyle | 252/514 |
| 4,187,201 | 2/1980 | Hilson et al. | 252/514 |
| 4,350,618 | 9/1982 | Hilson et al. | 252/518 |

*Primary Examiner*—Paul Lieberman
*Assistant Examiner*—Bradley A. Swope

[57] ABSTRACT

A gold conductor composition comprising by weight, basis total inorganic solids, finely divided particles of 75-95% metallic gold at least 90% by weight of which gold particle have an aspect ratio of no greater than 2, 0.5-10% cadmium borosilicate glass, 0.1-5% spinel-forming divalent metal oxide selected from the group consisting of CuO, ZnO, MgO, CoO, NiO, FeO, MnO and mixtures thereof, and 0.1-1.0% metal selected from the group consisting of palladium, platinum and rhodium, all of the foregoing particles being dispersed in an organic medium. This composition is useful in electronic packaging for forming conductor patterns on ceramic-based substrates, particularly patterns on which metallic components are bonded by brazing.

6 Claims, No Drawings

GOLD CONDUCTOR COMPOSITION FOR FORMING CONDUCTOR PATTERNS ON CERAMIC BASED SUBSTRATES

This application is a continuation of application Ser. No. 07/508,769, filed Apr. 12, 1990 now abandoned.

FIELD OF THE INVENTION

This invention relates to thick film conductor compositions. More particularly, it relates to gold conductor compositions which provide good adhesion to ceramic substrates.

BACKGROUND OF THE INVENTION

The current trend in microelectronic packaging is toward high performance applications which demand both a higher density of electronic functionality and functionalities which operate at higher speeds. Producing electronic packages which operate reliably and meet these demands of high performance applications is a challenge facing the microelectronic industry. One particularly difficult aspect of producing such packages is producing joints or bonds in multilayer packages between metallized components such as pins, leads, or heat sinks and ceramic substrates. These joints or bonds must have the mechanical durability, electrical conductivity and heat dissipation necessary to ensure reliable performance under the varying and extreme conditions encountered in high performance applications. Further, the process or method of joining the metallized components to the ceramic substrate must be as cost effective and simple as possible.

Currently in multilayer electronic packaging, there are several methods for attaching metallized components to ceramic substrates. The attachment method used is dependent upon the type of multilayer package being fabricated. For high temperature cofired systems which use alumina-based dielectric layers and tungsten or molybdenum metallizations, a brazing method is used for attachment. The brazing is carried out at a temperature of about 840° C. in a hydrogen-nitrogen atmosphere. This method results in good bond strengths and allows for temperature latitude in subsequent processing.

Low temperature thick film or cofired dielectric sheet systems use glass and alumina-based dielectrics and gold, silver or copper metallization. Brazing has not been successful with low-temperature systems because the temperatures of firing and brazing are essentially the same. This creates a condition where, during the brazing operation, the braze attacks the previously formed bond between the metallization and the ceramic, causing the metallization to separate from the substrate. A disruption of the electrical conductivity results rendering the package useless. Common methods of attachment which are used in lieu of brazing for these low temperature systems include soldering, wirebonding and welding, such as thermal compression and parallel gap welding.

Both of the foregoing systems including the respective methods of attachment are currently in use. However, these systems suffer from some disadvantages in high performance applications. In the high-temperature cofired packages, the electrical conductivity of the metallizations formed with tungsten and molybdenum is not as high as desired for high performance applications. In the low-temperature packages, the conductivity of the gold, silver or copper metallization is good, but the bond strengths are typically lower than those obtained by brazing and are not as high as desired for high performance applications. In addition, solder joint integrity can be lost during some subsequent processing operations.

There existed a need, therefore, for a process for brazing metallized components to low-temperature multilayer packages in order to obtain a package which had both high conductivity and good bond strength of metallized components. Such a brazing process has been developed and disclosed in U.S. Pat. No. 5,033,666. However, it was found that many standard gold conductor compositions did not adhere as well as other metal conductor compositions when used in such a brazing process. It is therefore an object of this invention to provide gold conductor compositions which can be used in a process for brazing metallized components to low temperature multilayer ceramic packages resulting in improved bond strengths and package integrity.

SUMMARY OF THE INVENTION

The present invention is directed to a gold conductor composition comprising by weight, basis total inorganic solids, finely divided particles of:

(a) 75-95% metallic gold particles at least 90% by weight of which particles have an aspect ratio no greater than 2;

(b) 0.5-10% cadmium borosilicate glass;

(c) 0.1-5% spinel-forming divalent metal oxide selected from the group consisting of CuO, ZnO, MgO, CoO, NiO, FeO, MnO and mixtures thereof;

(d) 0.1-1.0% metal selected from the group consisting of palladium, platinum and rhodium, all of (a) through (d) being dispersed in (e) an organic medium.

In a further aspect the invention is directed to a gold metallization obtained by firing the conductor composition to effect volatilization of the organic medium and liquid phase sintering of the glass and metal. Still further, the invention is directed to conductive elements comprising a nonconductive ceramic substrate having a conductive pattern affixed thereon formed by screen printing a pattern of the above-described gold conductor composition and firing the printed substrate to effect volatilization of the organic medium and liquid phase sintering of the glass and metal.

DETAILED DESCRIPTION OF THE INVENTION

A. Gold

The gold powder which can be used in the practice of the present invention should be monodisperse, that is, it should be homogeneous and all of the particles should be of the same shape. It is preferred that the gold powder have particles that are spherical in shape, i.e. have an aspect ratio no greater than two. The particle size of the gold is not narrowly critical from the standpoint of its technical effectiveness in the invention. However, the gold particles should be of a size appropriate to the manner in which they are applied, which is usually screen printing, and to the firing conditions. Generally, the particle size should be in the range of from about 0.4 to about 5 micrometers at the 50% point in the distribution curve, with 90% of the particles being less than 10 micrometers. Preferably, the particle size is in the range of from about 0.5 to about 2 micrometers at the 50% point in the distribution curve with 90% of the particles being less than 6 micrometers. The gold powder may contain trace amounts of wetting agent, such as cyanoguanidine, evenly dispersed throughout the powder, for example as would be achieved by mixing under moderate shear for a short period of time, e.g., 1–5 minutes, as in a blender.

Generally, the gold powder comprises 75 to 95% of the gold conductor composition based on the total weight of the inorganic solids. Preferably the gold powder comprises 80 to 88% of the conductor composition, and, more preferably, 82 to 85%.

B. Glass

The glass component of the gold conductor compositions of the invention is a cadmium borosilicate glass having a low-softening point and low viscosity at the firing temperature. In order to have adequate adhesion, the cadmium content in the glass should be substantial. In general, at least 40% by weight of the glass should be present as CdO. It is preferred that the PbO content be less than 0.005% by weight of the glass. Other easily reduced metal oxides are also to be avoided.

As used herein, the term low-softening point glass means glass having a softening point below 850° C. and, preferably, below 600° C. as measured by the fiber elongation method (ASTM-C338-57). The glass utilized in this invention also has a low viscosity at the firing temperature to aid liquid phase sintering of inorganic particulates. A glass having a specific viscosity of less than 6 at the firing temperature is preferred.

A particularly preferred glass has the following composition: CdO, 68.8%; $B_2O_3$, 18.6%; $SiO_2$, 9.5%; $Al_2O_3$, 3.1%.

The particle size of the glass frit is not critical, but generally should be less than 5 micrometers at the 50% point on the distribution curve. The glass frit should comprise 0.5 to 10% by weight based on the total inorganics, preferably 1 to 3% and most preferrably 1.5 to 2.5%. The glasses are prepared by conventional glass-making techniques.

C. Metal Oxide

The metal oxides (MeO) which are suitable for the practice of the invention are those which are capable of reacting with $Al_2O_3$ to form a spinel structure ($MeAl_2O_4$) when the composition is fired. Suitable inorganic oxides include CuO, ZnO, MgO, CoO, NiO, FeO, MnO and mixtures thereof. Precursors of the metal oxides such as carbonates and oxylates which will decompose under firing conditions to form the corresponding metal oxides may be used with comparable effectiveness.

The particle size of the metal oxides or precursors should be of a size appropriate to the manner in which the composition of the invention is applied, which is usually by screen printing. Thus the particle size should be in the same range as the gold, i.e., from about 0.5 to 5 micrometers at the 50% point on the distribution curve with 90% less than 10 micrometers.

The metal oxide generally comprises from about 0.1 to about 5% by weight based on the total inorganics, preferably from about 0.1 to 3%, and most preferably 0.1 to 1%.

D. Additional Metal

The additional metal in the gold conductor compositions of the invention is selected from the group consisting of palladium, platinum and rhodium. Palladium is preferred. It is preferred that the metal particles be approximately spherical in shape. The particle size is again dictated by the method of application, i.e. screen printing, and should be in the range of about 0.1 to 10 micrometers at the 50% point on the distribution curve. The additional metal comprises from about 0.1 to about 1% by weight based on the total inorganics.

E. Organic Medium

The organic medium used in the gold conductor compositions of the invention can be any of those generally used in conventional gold conductor compositions including solutions or dispersion of a resin in a solvent. Suitable resins include ethyl cellulose, polybutyl methacrylate, polyalphamethyl styrene or poly(ethylene vinyl acetate). A preferred resin is ethyl cellulose. Suitable solvents must be physically compatible with the resin and the resulting solution or dispersion must be chemically inert with respect to the other components of the gold conductor composition. Any one of various organic liquids can be used as the carrier for the organic resin. Suitable organic liquids include aliphatic alcohols (e.g., 1-decanol), esters of such alcohols (e.g., acetates or propionates), glycol ethers (e.g., dibutyl carbitol), terpines (e.g., pine oil or terpineol), and dialkyl phthalates (e.g., dibutyl phthalate or dimethyl phthalate). Optionally the solution or dispersion may also contain other additives such as thickening agents, stabilizing agents, thixotropes, wetting agents and the like.

It will be recognized by those skilled in the art that the amount of resin and other additives in the organic liquid can be adjusted in order to obtain the desired printing characteristics. In general, the concentration of resin in the organic liquid should be about 2 to 20% by weight, and preferably 10 to 15%.

The ratio of organic medium to inorganic solids in the conductor compositions of the invention can vary considerably and depends on the manner in which the dispersion is to be applied and the kind of organic medium used. Normally to achieve good coverage, the dispersion will contain complementally, 60–90% inorganic solids and 40–10% organic medium.

Formulation and Application

In the preparation of the compositions of the present invention, the inorganic solids are mixed with the organic medium and dispersed with suitable equipment, such as a three-roll mill, to form a suspension, resulting in a gold composition for which the viscosity will be in the range of about 100–400 pascal-seconds at a shear rate of 4 $sec^{-1}$.

The composition is then applied to a substrate, such as alumina or dielectric sheet, by the process of screen printing to a wet thickness of about 10–80 micrometers, preferably 10–70 micrometers, most preferably 10–50 micrometers. The printed patterns are then dried at about 80°–150° C. for about 5 to 15 minutes. Firing is preferably done in a belt conveyor furnace with a temperature profile that will allow burnout of the organic matter at about 300°–600° C., a period of maximum temperature of about 800°–950° C. lasting about 5 to 15 minutes, followed by a controlled cooldown cycle to prevent over-sintering, unwanted chemical reactions at intermediate temperature or substrate fracture from too rapid cooldown. The overall firing procedure will preferably extend over a period of about one hour, with 20–25 minutes to reach the firing temperature, about 10 minutes at the firing temperature, and about 20–25 minutes in cool-down. The fired thickness of the gold metallization can range from about 4 to 25 micrometers.

Brazing Process

The brazing process for attaching metallized components to low-temperature cofired ceramic substrates comprises the steps of:

1. applying a first gold conductor composition on a ceramic substrate;
2. drying the first conductor composition;
3. firing the first conductor composition to effect volatilization of the organic medium, liquid phase flow and sintering of the inorganic materials to form a first metallization layer;
4. applying a second gold conductor composition on the first metallization layer so that the first metallization layer is covered by the second conductor composition;
5. drying the second conductor composition;
6. firing the second conductor composition to effect volatilization of the organic medium, liquid phase flow and sintering of the inorganic materials to form a second metallization layer;
7. forming an assembly by positioning at least one metal component such as a pin, lead, window frame or heat sink, and a brazing composition on the second metallization; and
8. heating the assembly at a temperature sufficient for the brazing composition to form a joint between the metal component and the second metallization layer.

Substrates for use in the brazing process can be any of the well-known ceramic-based substrates conventional in the art. Examples of ceramic substrates conventionally used in microelectronic circuitry include alumina, beryllia, hafnia, nitrides, carbides, etc. Also suitable for use in the brazing process are glass-ceramics and advanced ceramics such as aluminum nitride, silicon carbide, silicon nitride and boron nitride. A preferred substrate for use in this process is an alumina substrate comprised of 96% $Al_2O_3$. Most preferred is a glass-ceramic tape, such as GreenTape(TM) sold by E. I. du Pont de Nemours, Wilmington, Del.

The first metallization layer is prepared using the gold conductor composition of the invention. The conductor composition is applied to the substrate by the process of screen printing to a wet thickness of about 10–80 micrometers, preferably 10–70 micrometers, most preferably 10–50 micrometers. The printed patterns are then dried at about 80°–150° C. for about 5 to 15 minutes. Firing is preferably done in a belt conveyor furnace with a temperature profile that will allow burnout of the organic matter at about 300°–600° C., a period of maximum temperature of about 800°–950° C. lasting about 5 to 15 minutes, followed by a controlled cool-down cycle to prevent over-sintering, unwanted chemical reactions at intermediate temperature or substrate fracture from too rapid cooldown. The overall firing procedure will preferably extend over a period of about one hour, with 20–25 minutes to reach the firing temperature, about 10 minutes at the firing temperature, and about 20–25 minutes in cool-down. The fired thickness of the gold metallization can range from about 4 to 25 micrometers.

The second metallization layer is formed when a second conductor composition is applied to the first metallization layer using similar thick film techniques, preferably screen printing. It is important in this step to apply the second conductor composition in such a manner so as to completely coat or cover the exposed portions of the first metallization layer where the metal components are to be attached. This is performed by exact screen registration of the second metallization layer on the first metallization layer or by using a second screen for the second metallization layer with a pattern (e.g. pad size) which is slightly larger (about 5%) compared to the pad size used for the first metallization layer. This may mean that several series of print, dry, fire steps would be required to cover the first metallization layer and to protect the ceramic-first metallization interface. Drying of the second metallization layer or layers is the same as described above for the drying of the first metallization layer. The procedure for firing the second metallization layer is similar to that described for the first metallization layer except that conditions may be modified to accommodate the desired fired thickness of the second metallization layer, as is understood by one skilled in the art. Fired thickness of the second metallization layer is 5–100 micrometers. The thickness depends on the type and the melting temperature of the brazing alloy to be used. The higher the melting temperature of the brazing alloy, the greater the thickness of the second layer. For a brazing temperature of about 550° C., the thickness of the second metallization layer is about 10–30 micrometers. For a brazing temperature of about 760° C., the thickness of the second layer is about 30 to 80 micrometers.

The second conductor composition which forms the second metallization layer comprises a finely divided gold powder dispersed in an organic medium. The gold particles in the second conductor composition sinter during the firing step to themselves and to the metal particles of the first metallization layer located at the surface of the interface between the first and second metallization layers. The function of the organic medium of the second conductor composition is the same as for the organic medium in the first conductor composition. Here, too, the organic medium is conventional in the art and can have the same or different composition as the organic medium described for the first conductor composition. It is preferred that inorganic binders are not used in the second metallization layer. However, small amounts of inorganic binders up to 10 percent by weight of the solids can also be used successfully.

It is also possible for the separate firing of the first and second metallization layers to be combined as a single step. Prior to the combined firing step, the first conductor composition is applied and dried, then the second conductor composition is applied in registration and dried. Firing of both layers is similar to that described above for separate layer firing.

Metal components useful for attachment to ceramic substrates are for example pins, leads, and heat sinks. These components are metallized since they function as an interconnect between other electronic packages or as in the case of heat sinks, for the absorption or dissipation of unwanted heat. Metal components suitable for use in this process can be formed from copper, nickel, molybdenum, tungsten, silver, gold, iron, carbon graphite or alloys or clads or mixtures thereof. Preferred for use with glass-ceramic substrates are alloys of iron and nickel such as Kovar, Alloy 42, Alloy 46 for pin and lead materials while copper/tungsten, copper/molybdenum, copper/molybdenum/copper, and copper/Invar/copper are used as heat sinks and spreaders. These materials are used because their Thermal Coefficient of Expansion (TCE) is compatible with that of the ceramic substrate. The compatible TCE helps to minimize the residual thermal stresses produced during the brazing process. Also, the metal components are able to retain their mechanical integrity (no appreciable annealing) after furnace brazing. The metal components can be plated with nickel alone or followed by gold, copper or silver if desired.

Conventional brazing filler metal compositions which are compatible with the second metallization layer and the metallized component, are suitable for use in this process. A brazing composition which is suitable for use with gold metallizations is 82Au/18In, wherein the numbers indicate weight percentage. The braze compound can be in paste or preform state. The braze paste is applied using screen printing, stencil printing or dispensing techniques. The braze can also be applied on the pad or the component and preflowed prior to the braze joining process.

Components to be joined by brazing are usually assembled in a fixed position which is maintained throughout the brazing cycle, typically through the use of auxiliary fixturing. Materials such as mild steels, Kovar, machinable ceramics, lava, and graphite are often used for auxiliary fixturing. A particularly preferred fixturing material is graphite. The selection of a fixturing material is determined by the material's properties, e.g. heat resistance, in conjunction with the brazing method employed, the brazing temperature and atmosphere used, the materials in the assembly, and the dimensional requirements for the finished package. Surfaces to be joined are spaced properly by the fixture to preserve joint clearance at room and brazing temperatures in order that the brazing filler metal may fill the joint and achieve maximum properties. The braze compound, in either paste or preform state, is located between the metallized component and the second metallization layer or can be on the metallized component in a manner such that the braze compound will fill the joint. For example, braze preform compound can be secured in place for brazing by the shaft of a pin component.

Brazing of the metallized components to the metallization layers of the ceramic substrate occurs in a brazing furnace where the fixtured assembly is placed. The assembly is gradually heated in the brazing furnace for a period of time and at a temperature sufficient to cause the braze filler metal compound to wet and form a joint. The peak temperature is normally 20° to 80° C. higher than the melting point of the braze filler metal. The fixtured assembly is heated at the peak temperature for a very short period of time, usually on the order of 1 minute, followed by a gradual cooldown. Suitable furnaces for brazing are batch, and belt conveyor (IR or muffle). Preferred is to use a belt conveyor furnace. For a Au/In braze, a reducing atmosphere is used in the furnace. Generally this is a mixture of hydrogen and nitrogen.

In order to be commercially acceptable, the pull strength of the metallized component should be at least 15 pounds as measured by an Instron test. It is preferred that the pull strength be greater than 20 pounds.

EXAMPLES

I. Materials

| | |
|---|---|
| Gold: | spherical gold powder, $D_{50}$ particle size of 0.7–1.7 micrometers |
| Palladium: | palladium powder, surface area 6.1–9.6 $m^2/g$ |
| Copper Oxide: | CuO powder, surface area 1.3–3.2 $m^2/g$ |
| Glass: | $D_{50}$ particle size 2.5–3.5 micrometer |
| | Frit 1 = $B_2O_3$ (18.6%), CdO (68.8%), $SiO_2$ (9.5%), $Al_2O_3$ (3.1%) |
| | Frit 2 = CaO (4.0%); BaO (0.9%), ZnO (27.6%), $SiO_2$ (21.7%), $B_2O_3$ (26.7%), NaO (8.7%), PbO (0.7%), $Al_2O_3$ (5.7%), $ZrO_2$ (4.0%) |
| | Frit 3 = MgO (2.1%); BaO (36.3%), NiO (4.6%), $SiO_2$ (16.5%), $B_2O_3$ (37.5%), $ZrO_2$ (3.0%) |
| | Frit 4 = PbO (83.0%), $PbF_2$ (4.9%), $SiO_2$ (1.1%), $B_2O_3$ (11.0%) |
| Substrate: | glass ceramic tape sold by E.I. du Pont de Nemours and Co. as Green Tape ™ (type 851AT). |

II. Test Procedure (a) A multilayer structure was fabricated with 10 layers of the tape substrate and conventional gold pastes using methods known in the art. The multilayer tape substrate was cut to 1.760 × 1.760 in. after cofiring.

(b) A gold paste with a given composition, corresponding to the first metallization layer, was printed on the external surface layer of the fired package body formed in (a) in one stroke with an 885 AMI printer, (manufactured by AMI Inc., North Branch, N.J.) to a wet thickness of 45 micrometers in order to achieve a fired thickness of 10 to 15 micrometers. The printed paste was located where the metallized components were to be attached. The paste on the green tape was dried in a Blue M oven, manufactured by Blue M Co. (Malvern, Pa.) in an air atmosphere at a temperature of 150° C. for 15–30 minutes. The paste was fired in air in a Lindberg furnace, (Lindberg, Chicago, Ill.) with an approximate cycle time of 1 hour, in which about 20 to 25 minutes was heating to firing temperature, firing occurred for 10 minutes at 850° C. and a controlled cooldown was for the remainder of the cycle time.

(c) The second conductor composition, comprising 88% gold flake powder and 12% organic medium, was printed over the first conductor metallization layer to a wet thickness of 40–50 micrometers, with the 885 AMI printer described in step (b) above. It is printed in such a manner as to completely cover the initial metallization layer including the sides of the bonding pads, by using a second screen for the second layer metallization with slightly larger pad size (about 5% larger) compared to the pad size of the first layer. The second conductor composition was printed in two print and dry steps in order to achieve the desired fired thickness of about 25 micrometers. Similar to step (b) above, the second conductor composition was dried in a Blue M oven.

(d) The paste was fired in air in a Lindberg furnace, with an approximate cycle time of 1 hour, in which about 20 to 25 minutes was heating to firing temperature, firing occurred for 10 minutes at 850° C. and a controlled cooldown was for the remainder of the cycle time.

(e) Kovar pins, sold by Astro Precision Inc., (Bayville, Conn.) were plated with 50 microinches of nickel and 50 microinches of gold by Sutronics Company, (Raleigh, N.C.).

(f) The package components were assembled in a graphite fixture which held the ceramic substrate with the successive metallization layers, the brazing preform, and the plated pins in the proper positions on the metallization layer for firing. The brazing preforms were made of 82Au/18In and are sold by Advanced Material Technology Corp., (Oriskany, N.Y.). The brazing preform was washer shaped and was placed over the extending pin shaft resting upon the head of the pin. The head of the pin was placed on the second metallization layer and held in place by the graphite fixture.

(g) Brazing was performed in a Watkins-Johnson furnace (Watkins-Johnson Co., Scotts Valley, Calif.) at a one hour profile with a peak temperature of 580° C., for two minutes, using a 3.7% hydrogen 96.3% nitrogen atmosphere. After the part had cooled sufficiently, the graphite fixture was disassembled and the assembled package removed.

The strength of the pin attachment or joint to the ceramic substrate was tested on an Instron machine, (Instron Corp., Canton, Mass.) with a crosshead speed 12 mm/min. The numbers reported are the average of 10 tests.

EXAMPLES 1-4

These examples illustrate the improved adhesion obtainable with the gold pastes of the invention when using green ceramic tape as the substrate. In Example 1 the gold paste of the invention was used, while Examples 2-4 are comparative examples. The compositions and results are given in Table 1 below.

TABLE 1

| Composition (parts by wt) | Example 1 | Comparative Examples 2 | 3 | 4 |
|---|---|---|---|---|
| Gold | 83.0 | 83.0 | 83.0 | 83.0 |
| Palladium | 0.3 | 0.3 | 0.3 | 0.3 |
| Copper Oxide | 0.5 | 0.5 | 0.5 | 0.5 |
| Frit 1 | 1.4 | | | |
| Frit 2 | | 3.0 | | |
| Frit 3 | | | 3.0 | |
| Frit 4 | | | | 1.4 |
| Organic Medium | 14.9 | 14.4 | 14.4 | 14.4 |
| Substrate | | green tape | | |
| Pull strength (pounds) | 25.0 | 18.0 | 1-2 | none |

EXAMPLES 5-7

These examples illustrate that the adhesion using the gold paste of the invention on alumina substrates (Example 5) is as good as that of other pastes. (Comparative Examples 6 and 7).

| Composition (parts by wt) | Example 5 | Comparative Examples 6 | 7 |
|---|---|---|---|
| Gold | 83.0 | 83.0 | 83.0 |
| Palladium | 0.3 | 0.3 | 0.3 |
| Copper Oxide | 0.5 | 0.5 | 0.5 |
| Frit 1 | 1.4 | | |
| Frit 2 | | 1.4 | |
| Frit 3 | | | 1.4 |
| Organic Medium | 14.9 | 14.4 | 14.4 |
| Substrate | | 96% alumina | |
| Pull strength (pounds) | 21.7 | 23.3 | 24.0 |

We claim:

1. A gold conductor composition comprising by weight, basis total inorganic solids, finely divided particles of:
   (a) 75-95% metallic gold particles of which at least 90% by weight consist essentially of spherical particles;
   (b) 0.5-10% cadmium borosilicate glass;
   (c) 0.1-5% spinel-forming divalent metal oxide selected from the group consisting of CuO, ZnO, MgO, CoO, NiO, FeO, MnO and mixtures thereof;
   (d) 0.1-1.0% metal selected from the group consisting of palladium, platinum and rhodium, all of (a) through (d) being dispersed in
   (e) an organic medium.

2. The composition of claim 1 wherein the organic medium comprises
   2-2 wt. % resin selected from the group consisting of ethyl cellulose, polybutyl methacrylate, polyalphamethyl styrene or poly(ethylene vinyl acetate); and
   98-80 wt. % organic liquid selected from the group consisting of aliphatic alcohols, esters of such alcohols, glycol ethers, terpines, and dialkyl phthalates.

3. The composition of claim 1 comprising 80-88% metallic gold.

4. The composition of claim 1 wherein the cadmium borosilicate glass consists essentially of 68.8 wt. % CdO, 18.6 wt. % $B_2O_3$, 9.5 wt. % $SiO_2$, and 3.1 wt. % $Al_2O_3$.

5. The composition of claim 1 comprising 0.1-1% spinel-forming divalent metal oxide.

6. A gold metallization formed by the process comprising
   (a) drying the gold conductor composition of claim 1; and
   (b) firing the dried composition at a temperature in the range of 800°-950° C.

* * * * *